United States Patent
Vanbesien et al.

(10) Patent No.: US 8,653,153 B1
(45) Date of Patent: Feb. 18, 2014

(54) VIOLET CURABLE INK

(71) Applicant: Xerox Corporation, Norwalk, CT (US)

(72) Inventors: Daryl W Vanbesien, Burlington (CA);
Barkev Keoshkerian, Thornhill (CA);
Naveen Chopra, Oakville (CA);
Michelle N Chretien, Mississauga (CA);
Jenny Eliyahu, Maple (CA); Nathan M Bamsey, Burlington (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 13/719,013

(22) Filed: Dec. 18, 2012

(51) Int. Cl.
*G03F 7/031* (2006.01)
*C08B 37/00* (2006.01)
*C08F 2/50* (2006.01)
*C08F 2/46* (2006.01)
*B29C 71/04* (2006.01)
*A61L 2/08* (2006.01)
*A61L 24/00* (2006.01)
*C08G 61/04* (2006.01)

(52) U.S. Cl.
USPC .............. 522/8; 522/7; 522/68; 522/6; 522/1; 522/71; 522/189; 522/184; 520/1

(58) Field of Classification Search
USPC ........... 522/8, 7, 68, 6, 1, 71, 189, 184; 520/1
See application file for complete search history.

(56) References Cited

U.S. PATENT DOCUMENTS

2011/0262711 A1* 10/2011 Chopra et al. ................ 428/172
2012/0302658 A1* 11/2012 Vanbesien et al. .............. 522/36

* cited by examiner

*Primary Examiner* — Ling Choi
*Assistant Examiner* — Jessica E Whiteley
(74) *Attorney, Agent, or Firm* — MDIP LLC

(57) ABSTRACT

A violet radiation curable ink including at least one curable monomer, at least one organic gellant, at least one photoinitiator, and at least one colorant, wherein the ink exhibits a reflectance on a substrate at a loading of from about 2 mg/inch$^2$ to about 7 mg/inch$^2$ that ranges from 50% to about 60% at a wavelength of 500 nm and that ranges from 0% to about 10% at a wavelength of about 600 nm. Also, the violet ink substantially matches PANTONE® Violet.

19 Claims, No Drawings

VIOLET CURABLE INK

TECHNICAL FIELD

The disclosure is directed to curable inks, such as, radiation-curable inks, and use thereof in forming images, such as through inkjet printing. More specifically, the disclosure is directed to violet radiation-curable gel inks, where such inks match the color properties of the PANTONE® primary PANTONE® Violet, methods of making such inks, and methods of forming images with such inks

BACKGROUND INFORMATION

Inkjet printing systems and radiation-curable gel inks are known in the art. However, a need remains for improved gel ink compositions for developing higher quality images with greater color range.

Gel ink colors typically include, for example, cyan, magenta, yellow and black. Gel ink compositions covering more of the violet region of the color spectrum are desirable.

SUMMARY OF THE INVENTION

The present disclosure, in embodiments, addresses those various needs and problems by providing violet color radiation curable inks.

In embodiments, a violet radiation-curable gel ink is disclosed comprising at least one curable monomer, at least one organic gellant, at least one photoinitiator and at least one colorant, wherein the ink exhibits a reflectance on a substrate at a loading of from about 2 mg/inch$^2$ to about 7 mg/inch$^2$ that ranges from 20% to about 50% at a wavelength of 440 nm and that ranges from 0% to about 10% at a wavelength of about 500 nm and 630 nm, and that ranges from 0% to about 10% at a wavelength of about 630 nm.

In embodiments, a method of making a violet radiation-curable ink is disclosed including: mixing at least one curable monomer, at least one organic gellant, at least one photoinitiator and at least one colorant, wherein the ink exhibits a reflectance on a substrate at a loading of from about 2 mg/inch$^2$ to about 7 mg/inch$^2$ that ranges from 20% to about 50% at a wavelength of 440 nm, that ranges from 0% to about 10% at a wavelength of about 500 and 630 nm, and that ranges from 0% to about 10% at a wavelength of about 630 nm; heating the mixture; and cooling the heated mixture to form a gel ink, where the resulting ink matches PANTONE® Violet in colour within a $\Delta E_{2000}$ of about 3 or less.

Those and other improvements are accomplished by the compositions and methods described in embodiments herein.

DETAILED DESCRIPTION OF THE INVENTION

This disclosure is not limited to particular embodiments described herein, and some components and processes may be varied by one of ordinary skill, based on the disclosure.

In digital imaging, colored inks generally are used by printing halftone dots in varying concentrations and combinations to form the desired image. While the halftone dots typically small enough so as not to be visible, the texture produced by the dots can be visible and may be unacceptable for certain high quality applications, such as, printing high quality photographs. In addition to objectionable halftone texture, even small levels of nonuniformity can lead to objectionable visible noise, such as graininess, mottle, etc. The objectionable visible texture and noise may be reduced by using of colored inks that access colors in the violet region.

Image quality may be improved by adding one, two or more additional inks to form a system with five, six or more print heads. One color of ink of value and which will increase image quality is a PANTONE® printing primary, including, for example, PANTONE® Violet.

The PANTONE® Matching System of 14 color primaries may be viewed in terms of $\Delta E$, a single number that represents the 'distance' between two colors. A $\Delta E_{2000}$ of 2 to 3 generally is considered to be at the limit of visual perception.

An advantage of radiation-curable inks is the reduced jetting and gelling temperatures as compared to previous, standard hot melt inkjet inks. Standard hot melt inkjet inks must be jetted at high temperatures, whereas the presently disclosed inkjet ink compositions may exhibit gel and lower jetting temperatures. Lower gel temperatures can further facilitate smoothing or leveling of the jetted ink by the application of heat.

In this specification and the claims that follow, singular forms such as "a," "an," and "the" include plural forms unless the content clearly dictates otherwise.

All ranges disclosed herein include, unless specifically indicated, all endpoints and intermediate values. Unless otherwise indicated, all numbers expressing quantities, conditions and so forth used in the specification and claims are to be understood as being modified in all instances by the term, "about." "About," is meant to indicate a variation of no more than 20% from the stated value. Also used herein is the term, "equivalent," "similar," "essentially," "substantially," "approximating" and "matching," or grammatic variations thereof, have generally acceptable definitions or at the least, are understood to have the same meaning as, "about."

As used herein, "lightfastness" refers to the degree to which a dye resists fading due to light exposure. The Blue Wool Scale measures and calibrates the permanence of coloring dyes. Traditionally this test was developed for the textile industry but now has been adopted by the printing industry as measure of lightfastness of ink colorants.

Normally two identical dye samples are created. One is placed in the dark as the control and the other is placed in the equivalent of sunlight for a 3 month period. A standard blue-wool textile fading test card is also placed under the same light conditions as the sample under test. The amount of fading of the sample then is assessed by comparison to the original color.

A rating between 0 and 8 is awarded by identifying which one of the eight strips on the bluewool standard card has faded to the same extent as the sample under test. Zero denotes extremely poor color fastness whilst a rating of eight is deemed not to have altered from the original and thus credited as being lightfast and permanent. For an ink of interest, a lightfastness of about 6 or greater, about 7 or greater, about 8 or greater is desirable. In embodiments, lightfastness can be determined using devices available, for example, from Microscal Co., London, UK or Q-Lab Corp, Cleveland, Ohio.

The term, "functional group," refers, for example, to a group of atoms arranged in a way that determines the chemical properties of the group and the molecule thereto. Examples of functional groups include halogen atoms, hydroxyl groups, carboxylic acid groups and the like.

The term, "short-chain," refers, for example, to hydrocarbon chains of a size, "n," in which n represents the number of carbon atoms in the chain and wherein n is a number of from 1 to about 7, from about 2 to about 6, from about 3 to about 5.

The term, "curable," describes, for example, a material that may be cured via polymerization, including, for example, free radical routes, and/or in which polymerization is photoinitiated though use of a radiation-sensitive photoinitiator. The term, "radiation-curable," refers, for example, to all forms of curing on exposure to a radiation source, including light and heat sources and including in the presence or absence of initiators. Exemplary radiation-curing techniques include, but are not limited to, curing using ultraviolet (UV) light, for example having a wavelength of 200-400 nm or more rarely visible light, optionally, in the presence of photoinitiators and/or sensitizers, curing using electron-beam radiation, optionally, in the absence of photoinitiators, curing using thermal curing, in the presence or absence of high-temperature thermal initiators (and which may be largely inactive at the jetting temperature) and appropriate combinations thereof.

As used herein, the term, "viscosity," refers to a complex viscosity, which is the measurement that can be provided by a mechanical rheometer that subjects a sample to a steady shear strain or a small amplitude sinusoidal deformation. The shear strain is applied by the operator to the motor and the sample deformation (torque) is measured by the transducer. Alternatively, a controlled-stress instrument, where the shear stress is applied and the resultant strain is measured, may be used. Such a rheometer provides a periodic measurement of viscosity at various plate rotation frequencies, $\omega$, rather than the transient measurement of, for instance, a capillary viscometer. The reciprocating plate rheometer measures both the in phase and out of phase fluid response to stress or displacement. The complex viscosity, $\eta^*$, is defined as $\eta^* = \eta' - i\eta''$; where $\eta' = G''/\omega$, $\eta'' = G'/\omega$ and $i$ is $-1$. Alternatively a viscometer that can measure only the transient measurement of, for instance, a capillary or shear viscosity can also be used.

"Optional," or, "optionally," refers, for example, to instances in which subsequently described circumstance may or may not occur, and include instances in which the circumstance occurs and instances in which the circumstance does not occur.

The terms, "one or more," and, "at least one," refer, for example, to instances in which one of the subsequently described circumstances occurs, and to instances in which more than one of the subsequently described circumstances occur.

"Substrate," refers to a material onto which an ink is applied. For example, paper, metal, plastic, a membrane or combination thereof, would be considered substrates.

"Double MEK Rub," refers to an Evaluation for Solvent Resistance by Solvent Rub Test—ASTM D4752 and NCCA 11-18. The test method is used to determine the degree of cure of an ink by the ink resistance to a specified solvent. The solvent rub test usually is performed using methyl ethyl ketone (MEK) as the solvent. ASTM D4752 involves rubbing the surface of a surface containing the ink with cheesecloth soaked with MEK until failure or breakthrough of the ink occurs. The type of cheesecloth, the stroke distance, the stroke rate and approximate applied pressure of the rub are specified. The rubs are counted as a double rub (one rub forward and one rub backward constitutes a double rub).

Monomers

In embodiments, the ink composition may include one or more monomers or comonomers. The combination of the monomers or comonomers may aid in solubilizing the gellant material. The monomers or comonomers may be chosen from any suitable radiation-curable monomers.

In embodiments, ink compositions may comprise a first monomer, due to the solubility and gelling properties of gellant materials, such as, epoxy-polyamide composite gellants, which are useful for producing ink compositions including an ink vehicle having a thermally-driven and reversible gel phase, where the ink vehicle is comprised of curable liquid monomers, such as UV-curable liquid monomers. The gel phase of such ink compositions allows an ink droplet to be pinned to a receiving substrate.

Examples of the curable monomer of the composition of interest include propoxylated neopentyl glycol diacrylate (such as SR-9003 from Sartomer), diethylene glycol diacrylate, triethylene glycol diacrylate, hexanediol diacrylate, dipropyleneglycol diacrylate, tripropylene glycol diacrylate, epoxylated neopentyl glycol diacrylate, isodecyl acrylate, tridecyl acrylate, isobornyl acrylate, isobornyl(meth)acrylate, propoxylated trimethylolpropane triacrylate, ethoxylated trimethylolpropane triacrylate, di-trimethylolpropane tetraacrylate, dipentaerythritol pentaacrylate, ethoxylated pentaerythritol tetraacrylate, propoxylated glycerol triacrylate, isobornyl methacrylate, lauryl acrylate, lauryl methacrylate, neopentyl glycol propoxylate methylether monoacrylate, isodecylmethacrylate, caprolactone acrylate, 2-phenoxyethyl acrylate, isooctylacrylate, isooctylmethacrylate, mixtures thereof and the like. As relatively non-polar monomers, mention may be made of iso decyl(meth)acrylate, caprolactone acrylate, 2-phenoxyethyl acrylate, isooctyl (meth)acrylate and butyl acrylate. In addition, multifunctional acrylate monomers/oligomers may be used not only as reactive diluents but also as materials that can increase the cross-link density of the cured image, thereby enhancing the toughness of the cured images.

The term, "curable monomer," is also intended to encompass curable oligomers, which may also be used in the composition. Examples of suitable radiation-curable oligomers that may be used in the compositions have a low viscosity, for example, from about 50 cPs to about 10,000 cPs, from about 75 cPs to about 7,500 cPs, from about 100 cPs to about 5,000 cPs. Examples of such oligomers may include CN549, CN131, CN131B, CN2285, CN 3100, CN3105, CN132, CN133, CN132, available from Sartomer Company, Inc., Exeter, Pa., EBECRYL 140, EBECRYL 1140, EBECRYL 40, EBECRYL 3200, EBECRYL 3201, EBECRYL 3212, available from Cytec Industries Inc, Smyrna Ga., PHOTOMER 3660, PHOTOMER 5006F, PHOTOMER 5429, PHOTOMER 5429F, available from Cognis Corporation, Cincinnati, Ohio, LAROMER PO 33F, LAROMER PO 43F, LAROMER PO 94F, LAROMER UO 35D, LAROMER PA 9039V, LAROMER PO 9026V, LAROMER 8996, LAROMER 8765, LAROMER 8986, available from BASF Corporation, Florham Park, N.J., and the like. As multifunctional acrylates and methacrylates, mention may also be made of pentaerythritol tetra(meth)acrylate, 1,2 ethylene glycol di(meth)acrylate, 1,6 hexanediol di(meth)acrylate, 1,12-dodecanol di(meth)acrylate, tris(2-hydroxy ethyl) isocyanurate triacrylate, propoxylated neopentyl glycol diacrylate, hexanediol diacrylate, tripropylene glycol diacrylate, dipropylene glycol diacrylate, amine-modified polyether acrylates (available as PO 83 F, LR 8869 and/or LR 8889 (all available from BASF Corporation)), trimethylolpropane triacrylate, glycerol propoxylate triacrylate, dipentaerythritol penta-/hexa-acrylate, ethoxylated pentaerythritol tetraacrylate (available from Sartomer Co. Inc. as SR 494) and the like.

In embodiments, the monomers may be chosen from short-chain alkyl glycol diacrylates or ether diacrylates, such as, propoxylated neopentyl glycol diacrylate, or from acrylates having short-chain alkyl ester substituents, such as, caprolactone acrylate, and the commercially available products CD536, CD 2777, CD585 and CD586 (available from Sartomer Co. Inc.).

In embodiments, the radiation-curable gel ink compositions may include one or more monomers in an amount ranging from about 10% to about 80% by weight of the ink, from about 20% to about 70%, from about 30% to about 60%.

In embodiments, to enable curing of unsaturated polymers, the inks of the present disclosure may also contain a photo-initiator that can be, for example, a polymeric or oligomeric hydroxy ketone. It has been found that such photoinitiators provide surprising results of not altering the coloristic properties of the inks and not depressing the glass transition temperature of the resin that may lead to blocking or cohesion problems, contrary to results that are provided by other photo-initiators. Furthermore, some or all of the polymeric or oligomeric hydroxy ketone photoinitiators are safe for such applications as food packaging and the like, being FDA approved. Examples of suitable polymeric or oligomeric hydroxy ketone photoinitiators include oligo[2-hydroxy-2-methyl-1-[4-1 methylvinyl)phenyl]propanone] compounds of the formula:

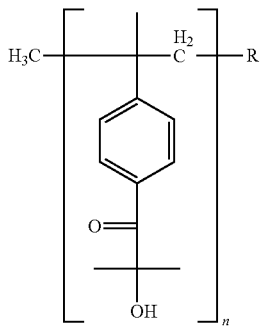

where R is H, $CH_3$ or an alkyl radical represented by $C_nH_{2n+1}$ in which n is a positive integer from 2 to about 1000. Commercial examples of such polymeric or oligomeric hydroxy ketone photoinitiators include the ESACURE® photo-initiators available from Lamberti (Sartomer) Company, Inc., such as, ESACURE® One series (ESACURE® One 75, ESACURE® One 65) and the ESACURE® KIP series (KIP 150, KIP 75LT, KIP IT, KIP 100 F). Mixtures of two or more such polymeric or oligomeric hydroxy ketone photoinitia-tors, or one or more polymeric or oligomeric hydroxy ketone photoinitiator and one or more conventional photoinitiator, can also be used.

Gellant

An ink of interest can comprise at least one gellant, or gelling agent, which functions at least to increase the viscos-ity of the ink composition within a desired temperature range. For example, the gellant can form a solid-like gel in the ink composition at temperatures below the gel point of the gel-lant, for example below the temperature at which the ink composition is applied.

The gel phase typically comprises a solid-like phase and a liquid phase in coexistence, wherein the solid-like phase forms a three-dimensional network structure throughout the liquid phase and prevents the liquid phase from flowing at a macroscopic level. Hence, viscosity of an ink composition in the solid-like phase can range from about $10^4$ to about $10^8$ cPs, from about $10^3$ to about $10^7$ cPs, from about $10^{3.5}$ to about $10^{6.5}$ cPs. The ink composition exhibits a thermally reversible transition between the gel state and the liquid state when the temperature is varied above or below the gel point of the ink composition. This temperature is generally referred to as a sol-gel temperature. The cycle of gel reformation can be repeated a number of times since the gel is formed by physi-cal, non-covalent interactions between the gelling agent mol-ecules, such as, hydrogen bonding, aromatic interactions, ionic bonding, coordination bonding, London dispersion interactions and the like. Stimulation by physical forces, such as, temperature or mechanical agitation or chemical forces such as pH or ionic strength, can cause reversible transition from liquid to semi-solid state at the macroscopic level.

The temperature at which the ink composition is in gel state is, for example, approximately from about 15° C. to about 55° C., from about 15° C. to about 50° C. The gel ink composition may liquefy at temperatures of from about 60° C. to about 90° C., from about 70° C. to about 85° C. In cooling from the application temperature liquid state to the gel state, the ink composition undergoes a significant viscosity increase. The viscosity increase can be at least three orders of magnitude, at least a four order of magnitude increase in viscosity.

The phase change nature of the gellant can thus be used to cause a rapid viscosity increase in the jetted ink composition on the substrate following jetting of the ink to the substrate. In particular, jetted ink droplets would be pinned into position on a receiving substrate, such as an image-receiving medium (for instance, paper), that is at a temperature cooler than the ink-jetting temperature of the ink composition through the action of a phase change transition in which the ink compo-sition undergoes a significant viscosity change from a liquid state to a gel state (or semi-solid state).

In embodiments, the temperature at which the ink compo-sition forms the gel state is any temperature below the jetting temperature of the ink composition, for example any tem-perature that is about 15° C. or more below, about 10° C. or more below, about 5° C. or more below the jetting tempera-ture of the ink composition. There is a rapid and large increase in ink viscosity on cooling from the jetting temperature at which the ink composition is in a liquid state to the gel transition temperature when the ink composition converts to the gel state.

A suitable gellant for the ink composition would gel the monomers/oligomers in the ink vehicle quickly and revers-ibly, and demonstrate a narrow phase change transition, for example, within a temperature range of about 10° C. to about 85° C. The gel state of exemplary ink compositions can exhibit a minimum of about $10^2$ mPa·s, about $10^{2.5}$ mPa·s, about $10^3$ mPa·s increase in viscosity at substrate tempera-tures, for instance, from about 30° C. to about 60° C., as compared to the viscosity at the jetting temperature. The gellant-containing ink compositions increase in viscosity within about 5° C. to about 10° C. below the jetting tempera-ture and ultimately reach a viscosity above about $10^4$ times the jetting viscosity, above about $10^4$, above about $10^6$ times the jetting viscosity.

Gellants include a curable gellant comprised of a curable amide, a curable polyamide-epoxy acrylate component and a polyamide component; a curable composite gellant com-prised of a curable epoxy resin and a polyamide resin, mix-tures thereof and the like, as disclosed in U.S. Publ. No. 20100304040, which hereby is incorporated herein by refer-ence in entirety. Inclusion of the gellant in the composition permits the composition to be applied over or on a substrate, such as, on one or more portions of a substrate and/or on one or more portions of an image previously formed on a sub-strate, without excessive penetration into the substrate because the viscosity of the composition increases as the composition cools following application. Excessive penetra-tion of a liquid into a porous substrate, such as paper, can lead to an undesirable decrease in substrate opacity. The curable gellant may also participate in the curing of monomer(s) of the composition.

The gellants suitable for use in the composition may be amphiphilic in nature to improve wetting, for example, when the composition is utilized over a substrate having silicone or other oil thereon. For example, the gellants may have long, non-polar hydrocarbon chains and polar amide linkages.

Amide gellants suitable for use include those described in U.S. Pat. Nos. 7,531,582, 7,276,614 and 7,279,587, the entire disclosure of each of which is incorporated herein by reference.

As described in U.S. Pat. No. 7,279,587, the amide gellant may be a compound of the formula:

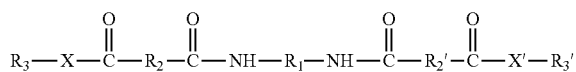

wherein: $R_1$ is:

(i) an alkylene group (wherein an alkylene group is a divalent aliphatic group or alkyl group, including linear and branched, saturated and unsaturated, cyclic and acyclic, and substituted and unsubstituted alkylene groups, and wherein heteroatoms, such as, oxygen, nitrogen, sulfur, silicon, phosphorus, boron and the like either may or may not be present in the alkylene group) having from 1 carbon atom to about 12 carbon atoms, from 1 carbon atom to about 8 carbon atoms, from 1 carbon atom to about 5 carbon atoms;

(ii) an arylene group (wherein an arylene group is a divalent aromatic group or aryl group, including substituted and unsubstituted arylene groups, and wherein heteroatoms, such as, oxygen, nitrogen, sulfur, silicon, phosphorus, boron and the like either may or may not be present in the arylene group) having from 1 carbon atom to about 15 carbon atoms, from about 3 carbon atoms to about 10 carbon atoms, from about 5 carbon atoms to about 8 carbon atoms;

(iii) an arylalkylene group (wherein an arylalkylene group is a divalent arylalkyl group, including substituted and unsubstituted arylalkylene groups, wherein the alkyl portion of the arylalkylene group can be linear or branched, saturated or unsaturated, and cyclic or acyclic, and wherein heteroatoms, such as, oxygen, nitrogen, sulfur, silicon, phosphorus, boron and the like either may or may not be present in either the aryl or the alkyl portion of the arylalkylene group) having from about 6 carbon atoms to about 32 carbon atoms, from about 6 carbon atoms to about 22 carbon atoms, from about 6 carbon atoms to about 12 carbon atoms; or (iv) an alkylarylene group (wherein an alkylarylene group is a divalent alkylaryl group, including substituted and unsubstituted alkylarylene groups, wherein the alkyl portion of the alkylarylene group can be linear or branched, saturated or unsaturated, and cyclic or acyclic, and wherein heteroatoms, such as, oxygen, nitrogen, sulfur, silicon, phosphorus, boron and the like either may or may not be present in either the aryl or the alkyl portion of the alkylarylene group) having from about 5 carbon atoms to about 32 carbon atoms, from about 6 carbon atoms to about 22 carbon atoms, from about 7 carbon atoms to about 15 carbon atoms, wherein the substituents on the substituted alkylene, arylene, arylalkylene and alkylarylene groups can be halogen atoms, cyano groups, pyridine groups, pyridinium groups, ether groups, aldehyde groups, ketone groups, ester groups, amide groups, carbonyl groups, thiocarbonyl groups, sulfide groups, nitro groups, nitroso groups, acyl groups, azo groups, urethane groups, urea groups, mixtures thereof and the like, wherein two or more substituents can be joined together to form a ring;

$R_2$ and $R_2'$ each, independently of the other, is:

(i) alkylene groups having from 1 carbon atom to about 54 carbon atoms, from 1 carbon atom to about 48 carbon atoms, from 1 carbon atom to about 36 carbon atoms;

(ii) arylene groups having from about 5 carbon atoms to about 15 carbon atoms, from about 5 carbon atoms to about 13 carbon atoms, from about 5 carbon atoms to about 10 carbon atoms;

(iii) arylalkylene groups having from about 6 carbon atoms to about 32 carbon atoms, from about 7 carbon atoms to about 33 carbon atoms, from about 8 carbon atoms to about 15 carbon atom; or (iv) alkylarylene groups having from about 6 carbon atoms to about 32 carbon atoms, from about 6 carbon atoms to about 22 carbon atoms, from about 7 carbon atoms to about 15 carbon atoms;

wherein the substituents on the substituted alkylene, arylene, arylalkylene and alkylarylene groups may be halogen atoms, cyano groups, ether groups, aldehyde groups, ketone groups, ester groups, amide groups, carbonyl groups, thiocarbonyl groups, phosphine groups, phosphonium groups, phosphate groups, nitrile groups, mercapto groups, nitro groups, nitroso groups, acyl groups, acid anhydride groups, azide groups, azo groups, cyanato groups, urethane groups, urea groups, mixtures thereof, and the like, and wherein two or more substituents may be joined together to form a ring;

$R_3$ and $R_3'$ each, independently of the other, is either:

(a) a photoinitiating group, such as, a group derived from 1-(4-(2-hydroxyethoxy)phenyl)-2-hydroxy-2-methylpropan-1-one, of the formula

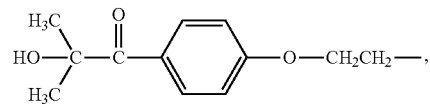

groups derived from 1-hydroxycyclohexylphenylketone, of the formula

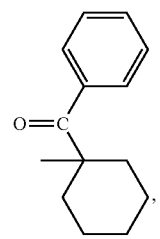

groups derived from 2-hydroxy-2-methyl-1-phenylpropan-1-one, of the formula

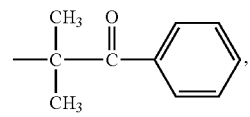

groups derived from N,N-dimethylethanolamine or N,N-dimethylethylenediamine, of the formula

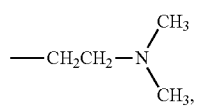

or the like, or:

(b) a group which is:

(i) an alkyl group (including linear and branched, saturated and unsaturated, cyclic and acyclic, and substituted and unsubstituted alkyl groups, and wherein heteroatoms, such as, oxygen, nitrogen, sulfur, silicon, phosphorus, boron and the like either may or may not be present in the alkyl group) having from about 2 carbon atoms to about 100 carbon atoms, from about 3 carbon atoms to about 60 carbon atoms, from about 4 carbon atoms to about 30 carbon atoms;

(ii) an aryl group (including substituted and unsubstituted aryl groups, and wherein heteroatoms, such as, oxygen, nitrogen, sulfur, silicon, phosphorus, boron and the like either may or may not be present in the aryl group) having from about 5 carbon atoms to about 100 carbon atoms, from about 5 carbon atoms to about 60 carbon atoms, from about 6 carbon atoms to about 30 carbon atoms, such as phenyl or the like;

(iii) an arylalkyl group (including substituted and unsubstituted arylalkyl groups, wherein the alkyl portion of the arylalkyl group can be linear or branched, saturated or unsaturated, and cyclic or acyclic, and wherein heteroatoms, such as, oxygen, nitrogen, sulfur, silicon, phosphorus, boron and the like either may or may not be present in either the aryl or the alkyl portion of the arylalkyl group) having from about 5 carbon atoms to about 100 carbon atoms, from about 5 carbon atoms to about 60 carbon atoms, from about 6 carbon atoms to about 30 carbon atoms, such as benzyl or the like; or (iv) an alkylaryl group (including substituted and unsubstituted alkylaryl groups, wherein the alkyl portion of the alkylaryl group can be linear or branched, saturated or unsaturated, and cyclic or acyclic, and wherein heteroatoms, such as, oxygen, nitrogen, sulfur, silicon, phosphorus, boron and the like either may or may not be present in either the aryl or the alkyl portion of the alkylaryl group) having from about 5 carbon atoms to about 100 carbon atoms, from about 5 carbon atoms to about 60 carbon atoms, from about 6 carbon atoms to about 30 carbon atoms, such as tolyl or the like, wherein the substituents on the substituted alkyl, arylalkyl and alkylaryl groups may be halogen atoms, ether groups, aldehyde groups, ketone groups, ester groups, amide groups, carbonyl groups, thiocarbonyl groups, sulfide groups, phosphine groups, phosphonium groups, phosphate groups, nitrile groups, mercapto groups, nitro groups, nitroso groups, acyl groups, acid anhydride groups, azide groups, azo groups, cyanato groups, isocyanato groups, thiocyanato groups, isothiocyanato groups, carboxylate groups, carboxylic acid groups, urethane groups, urea groups, mixtures thereof and the like, and wherein two or more substituents may be joined together to form a ring; and X and X' each, independently of the other, is an oxygen atom or a group of the formula $-NR_4-$, wherein $R_4$ is:

(i) a hydrogen atom;

(ii) an alkyl group, including linear and branched, saturated and unsaturated, cyclic and acyclic, and substituted and unsubstituted alkyl groups, and wherein heteroatoms either may or may not be present in the alkyl group, having from about 5 carbon atoms to about 100 carbon atoms, from about 5 carbon atoms to about 60 carbon atoms, from about 6 carbon atoms to about 30 carbon atoms, (iii) an aryl group, including substituted and unsubstituted aryl groups, and wherein heteroatoms either may or may not be present in the aryl group, having from about 5 carbon atoms to about 100 carbon atoms, from about 5 carbon atoms to about 60 carbon atoms, from about 6 carbon atoms to about 30 carbon atoms, (iv) an arylalkyl group, including substituted and unsubstituted arylalkyl groups, wherein the alkyl portion of the arylalkyl group may be linear or branched, saturated or unsaturated, and cyclic or acyclic, and wherein heteroatoms either may or may not be present in either the aryl or the alkyl portion of the arylalkyl group, having from about 5 carbon atoms to about 100 carbon atoms, from about 5 carbon atoms to about 60 carbon atoms, from about 6 carbon atoms to about 30 carbon atoms, or (v) an alkylaryl group, including substituted and unsubstituted alkylaryl groups, wherein the alkyl portion of the alkylaryl group can be linear or branched, saturated or unsaturated, and cyclic or acyclic, and wherein heteroatoms either may or may not be present in either the aryl or the alkyl portion of the alkylaryl group, having from about 5 carbon atoms to about 100 carbon atoms, from about 5 carbon atoms to about 60 carbon atoms, from about 6 carbon atoms to about 30 carbon atoms, wherein the substituents on the substituted alkyl, aryl, arylalkyl and alkylaryl groups may be halogen atoms, ether groups, aldehyde groups, ketone groups, ester groups, amide groups, carbonyl groups, thiocarbonyl groups, sulfate groups, sulfonate groups, sulfonic acid groups, sulfide groups, sulfoxide groups, phosphine groups, phosphonium groups, phosphate groups, nitrile groups, mercapto groups, nitro groups, nitroso groups, sulfone groups, acyl groups, acid anhydride groups, azide groups, azo groups, cyanato groups, isocyanato groups, thiocyanato groups, isothiocyanato groups, carboxylate groups, carboxylic acid groups, urethane groups, urea groups, mixtures thereof and the like, and wherein two or more substituents may be joined together to form a ring.

In embodiments, the gellant may comprise a mixture comprising:

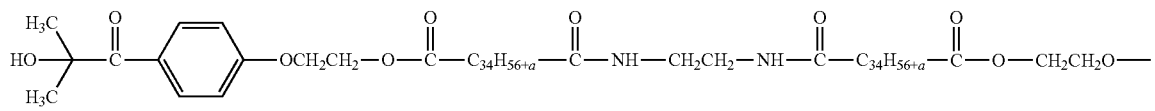

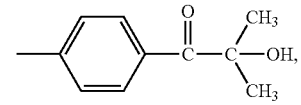

-continued

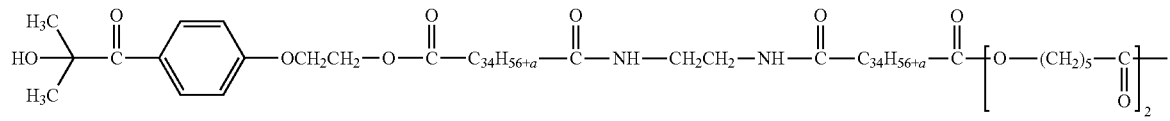

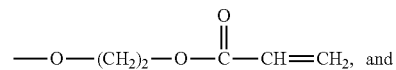

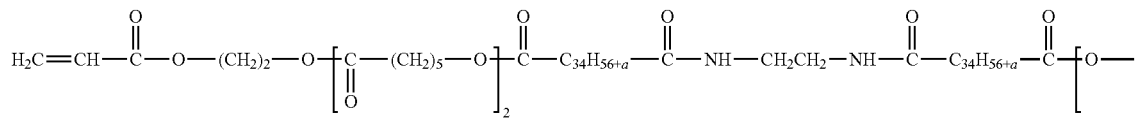

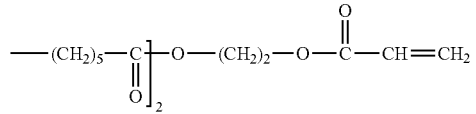

wherein —$C_{34}H_{56+a}$— represents a branched alkylene group which may include unsaturations and cyclic groups, wherein the variable "a" is an integer from 0-12.

In embodiments, the gelling agents of the ink may be compounds, as described in U.S. Pat. No. 8,084,637, which is hereby incorporated by reference. For example, compounds which can be used can be of the following general structures:

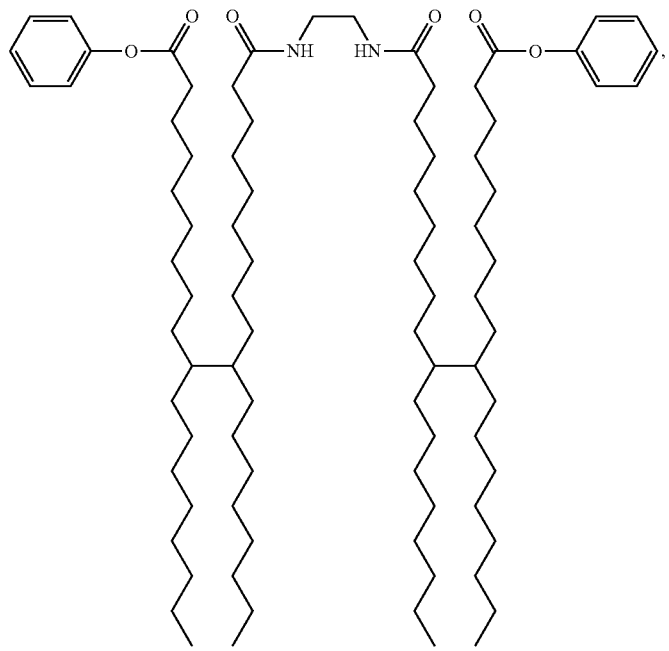

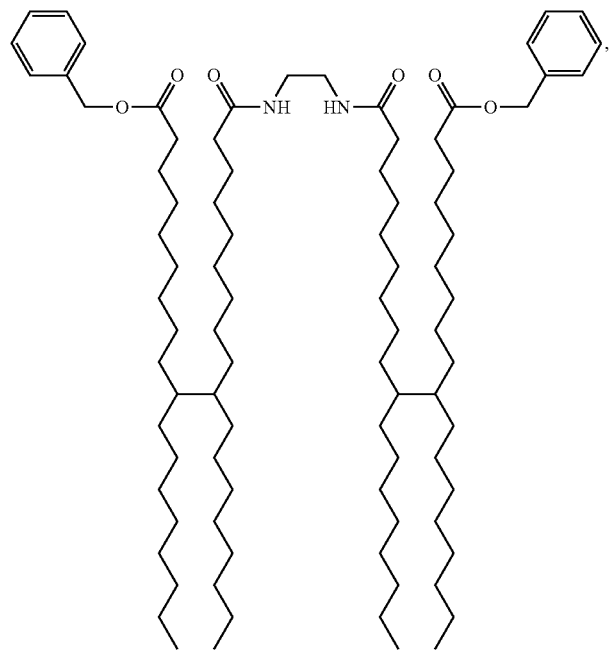
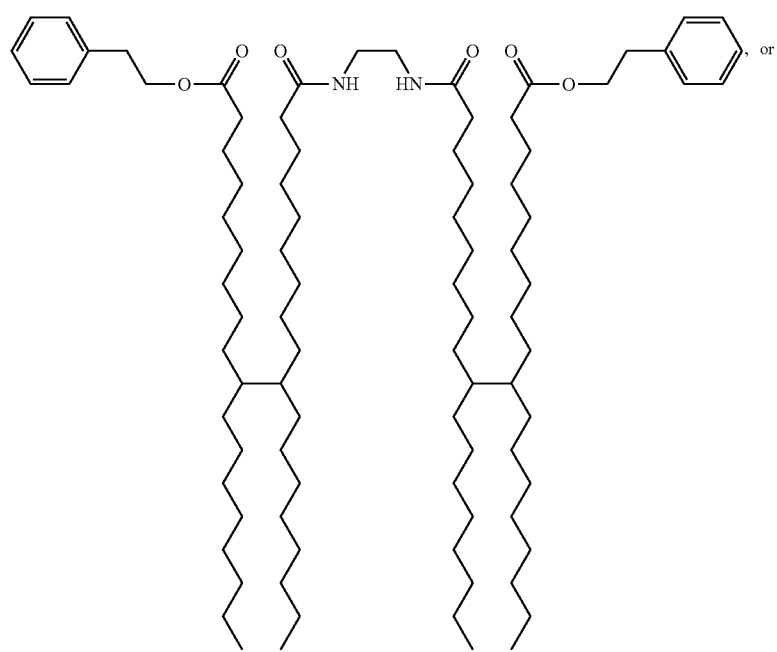

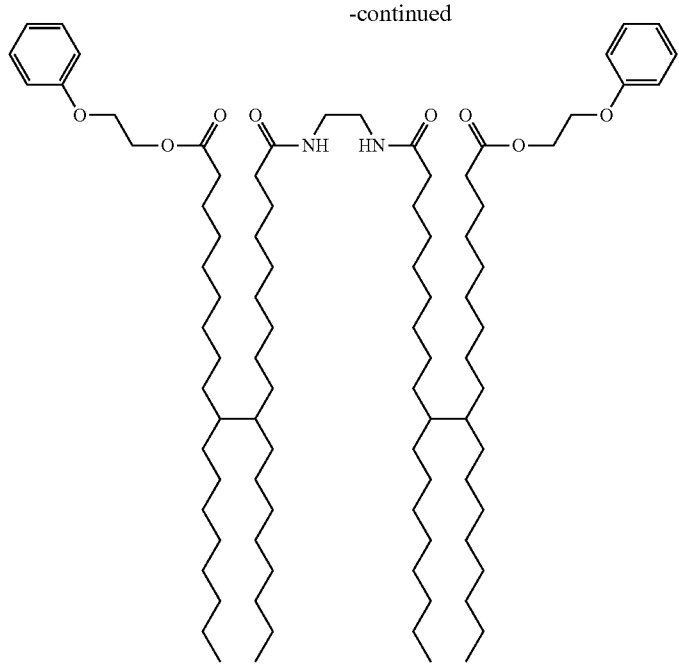

When present, the gelling agent or gellant can be present in amount of from about 1 percent to about 50 percent by weight of the ink, from about 2 percent to about 40 percent by weight of the ink, from about 5 percent to about 20 percent by weight of the total ink composition, although the amounts can be outside of those ranges.

Curable Waxes

The ink composition may optionally include at least one curable wax. Curable waxes may be made by methods as described in U.S. Publ. No. 20110247521, herein incorporated by reference in entirety.

The wax may be a solid at room temperature (about 25° C.). Inclusion of the wax may promote an increase in viscosity of the ink composition as the composition cools from the application temperature. Thus, the wax may also assist the gellant in avoiding bleeding of the composition through the substrate.

The curable wax may be any wax component that is miscible with the other components and will polymerize with the curable monomer to form a polymer. The term, "wax," includes, for example, any of the various natural, modified natural, and synthetic materials commonly referred to as waxes.

Suitable examples of curable waxes include waxes that include or are functionalized with curable groups. The curable groups may include, for example, an acrylate, methacrylate, alkene, allylic ether, epoxide, oxetane and the like. The waxes can be synthesized by the reaction of a wax, such as, a polyethylene wax equipped with a carboxylic acid or hydroxyl transformable functional group. The curable waxes described herein may be cured with the above curable monomer(s).

Suitable examples of hydroxyl-terminated polyethylene waxes that may be functionalized with a curable group include, but are not limited to, mixtures of carbon chains with the structure, $CH_3-(CH_2)_n-CH_2OH$, where there is a mixture of chain lengths, n, where the average chain length can be in the range of about 16 to about 50, and linear low molecular weight polyethylene, of similar average chain length. Suitable examples of such waxes include, but are not limited to, the UNILIN series of materials such as UNILIN 350, UNILIN 425, UNILIN 550, and UNILIN 700 with $M_n$ approximately equal to 375, 460, 550 and 700 g/mol, respectively. All of the waxes are commercially available from Baker-Petrolite. Guerbet alcohols, characterized as 2,2-dialkyl-1-ethanols, are also suitable compounds. Exemplary Guerbet alcohols include those containing about 16 to about 36 carbons, many of which are commercially available from Jarchem Industries Inc., Newark, N.J., PRIPOL 2033 from Croda, Edison, N.J. and so on. For example, C-36 dimer diol mixtures may be used, including isomers of the formula:

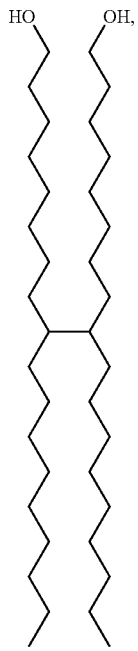 [SMILES: CCCCCCCCCC(CCCCCCCCO)C(CCCCCCCCC)CCCCCCCCO]

as well as other branched isomers that may include unsaturations and cyclic groups, available from Uniqema, New Castle, Del. Further information on $C_{36}$ dimer diols of that type is disclosed in, for example, "Dimer Acids," Kirk-Othmer Encyclopedia of Chemical Technology, Vol. 8, 4$^{th}$ Ed. (1992), pp. 223 to 237, the disclosure of which is incorporated herein by reference. The alcohols can be reacted with carboxylic acids equipped with UV curable moieties to form reactive esters. Examples of such acids include acrylic and methacrylic acids, available from Sigma-Aldrich Co.

Suitable examples of carboxylic acid-terminated polyethylene waxes that may be functionalized with a curable group include mixtures of carbon chains with the structure, $CH_3$—$(CH_2)_n$—COOH, where there is a mixture of chain lengths, n, where the average chain length is about 16 to about 50, and linear low molecular weight polyethylene, of similar average chain length. Suitable examples of such waxes include, but are not limited to, UNICID 350, UNICID 425, UNICID 550 and UNICID 700 with M. equal to approximately 390, 475, 565 and 720 g/mol, respectively. Other suitable waxes have a structure, $CH_3$—$(CH_2)_n$—COOH, such as, hexadecanoic or palmitic acid with n=14, heptadecanoic, margaric or daturic acid with n=15, octadecanoic or stearic acid with n=16, eicosanoic or arachidic acid with n=18, docosanoic or behenic acid with n=20, tetracosanoic or lignoceric acid with n=22, hexacosanoic or cerotic acid with n=24, heptacosanoic or carboceric acid with n=25, octacosanoic or montanic acid with n=26, triacontanoic or melissic acid with n=28, dotriacontanoic or lacceroic acid with n=30, tritriacontanoic or ceromelissic or psyllic acid, with n=31, tetratriacontanoic or geddic acid with n=32, or pentatriacontanoic or ceroplastic acid with n=33. Guerbet acids, characterized as 2,2-dialkyl ethanoic acids, are also suitable compounds. Exemplary Guerbet acids include those containing 16 to 36 carbons, many of which are commercially available from Jarchem Industries Inc., Newark, N.J., PRIPOL 1009 (Croda, Edison, N.J.) and so on. For example, C-36 dimer acid mixtures may also be used, including isomers of the formula:

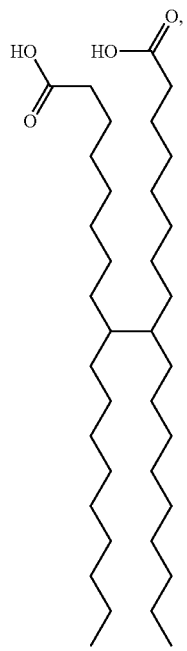 [SMILES: CCCCCCCCCC(CCCCCCCC(=O)O)C(CCCCCCCCC)CCCCCCCC(=O)O]

as well as other branched isomers that may include unsaturations and cyclic groups, available from Uniqema, New Castle, Del. Further information on such $C_{36}$ dimer acids is disclosed in, for example, "Dimer Acids," Kirk-Othmer Encyclopedia of Chemical Technology, Vol. 8, 4$^{th}$ Ed. (1992), pp. 223 to 237. The carboxylic acids can be reacted with alcohols equipped with UV curable moieties to form reactive esters. Examples of the alcohols include, but are not limited to, 2-allyloxyethanol from Sigma-Aldrich Co.;

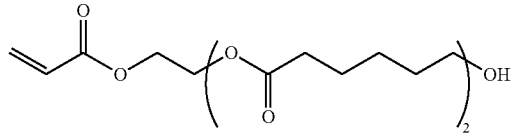

SR495B from Sartomer Company, Inc.;

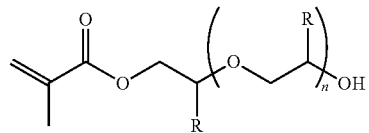

CD572 (R=H, n=10) and SR604 (R=Me, n=4) from Sartomer Company, Inc.

The curable wax can be included in the composition in an amount of from, for example, about 0.1% to about 30% by weight of the composition, from about 0.5% to about 20%, from about 0.5% to 15%.

Initiators

The radiation-curable gel ink may optionally include an initiator, such as, for example, a photoinitiator. An initiator can assist in curing the ink.

In embodiments, a photoinitiator that absorbs radiation, for example, UV light radiation, to initiate curing of the curable components of the ink may be used. Ink compositions containing acrylate groups or inks comprised of polyamides may include photoinitiators such as benzophenones, benzoin ethers, benzil ketals, α-hydroxyalkylphenones, α-alkoxyalkylphenones α-aminoallylphenones and acylphosphine photoinitiators sold under the trade designations of IRGACURE and DAROCUR from Ciba. Specific examples of suitable photoinitiators include 2,4,6-trimethylbenzoyldiphenylphosphine oxide (available as BASF LUCIRIN TPO); 2,4,6-trimethylbenzoylethoxyphenylphosphine oxide (available as BASF LUCIRIN TPO-L); bis(2,4,6-trimethylbenzoyl)-phenyl-phosphine oxide (available as Ciba IRGACURE 819) and other acyl phosphines; 2-methyl-1-(4-methylthio)phenyl-2-(4-morphorlinyl)-1-propanone (available as Ciba IRGACURE 907) and 1-(4-(2-hydroxyethoxy)phenyl)-2-hydroxy-2-methylpropan-1-one (available as Ciba IRGACURE 2959); 2-benzyl 2-dimethylamino 1-(4-morpholinophenyl) butanone-1 (available as Ciba IRGACURE 369); 2-hydroxy-1-(4-(4-(2-hydroxy-2-methylpropionyl)-benzyl)-phenyl)-2-methylpropan-1-one (available as Ciba IRGACURE 127); 2-dimethylamino-2-(4-methylbenzyl)-1-(4-morpholin-4-ylphenyl)-butanone (available as Ciba IRGACURE 379); titanocenes; isopropylthioxanthone; 1-hydroxy-cyclohexylphenylketone; benzophenone; 2,4,6-trimethylbenzophenone; 4-methylbenzophenone; diphenyl-(2,4,6-trimethylbenzoyl)phosphine oxide; 2,4,6-trimethylbenzoylphenylphosphinic acid ethyl ester; oligo(2-hydroxy-2-methyl-1-(4-(1-methylvinyl)phenyl)propanone); 2-hydroxy-2-methyl-1-phenyl-1-propanone; benzyl-dimethylketal; and mixtures thereof. Mention may also be made of amine synergists, i.e., co-initiators that donate a hydrogen atom to a photoinitiator and thereby form a radical species that initiates polymerization (amine synergists can also consume oxygen dissolved in the ink as oxygen inhibits free radical polymerization), for example, ethyl-4-dimethylaminobenzoate and 2-ethylhexyl-4-dimethylaminobenzoate. Any known photoinitiator that initiates free radical reaction on exposure to a desired wavelength of radiation, such as, UV light, can be used without limitation.

In embodiments, the photoinitiator may absorb radiation of about 200 to about 420 nm to initiate cure, although use of initiators that absorb at longer wavelengths, such as, the titanocenes that may absorb up to 560 nm, may also be used without restriction.

The total amount of initiator included in the ink composition may be from, for example, about 0.5 to about 15% by weight of the ink composition, from about 1 to about 10%.

Colorants

In embodiments, the violet solid ink includes at least one colorant or a mixture of two or more colorants. As used herein the term, "colorant," includes pigments, dyes, mixtures of dyes, mixtures of pigments, mixtures of dyes and pigments, and the like.

In embodiments, "violet," inks may be produced that match PANTONE® Violet when printed on standard paper. The inks use standard pigments that are light-fast and known to be compatible with the ink formulation.

Measurement of the color can, for example, be characterized by CIE specifications, commonly referred to as CIE $L^*$, $a^*$, $b^*$, where $L^*$, $a^*$ and $b^*$ are the modified opponent color coordinates, which form a 3 dimensional space, with $L^*$ characterizing the lightness of a color, $a^*$ approximately characterizing the redness/greenness, and $b^*$ approximately characterizing the yellowness/blueness of a color. The pigment concentration is chosen so that lightness ($L^*$) corresponds with the desired ink mass on the substrate. All of the parameters may be measured with any industry standard spectrophotometer including those obtained, for example, from X-Rite Corporation. Color differences may be quantified as E, or the color difference between a sample color and a reference color. $\Delta E$ may be calculated by any acceptable formula known in the art, for example, by using the CIE $\Delta E_{2000}$ formula. The $L^*$, $a^*$ and $b^*$ data required for determining $\Delta E_{2000}$ may be calculated, for example, under D50 illuminant and 2° observer, using reflectance spectra which may be measured with a spectrophotometer, for example, a GretagMacbeth SPECTROLINO® spectrophotometer.

In violet solid ink compositions, the target color for the violet may be selected to substantially match or substantially be the same as the color PANTONE® Violet. Colors are, "substantially," the same when the colors have a $\Delta E_{2000}$ color difference of less than about 5, less than about 4, less than about 3, less than about 2, less than about 1. Thus, a violet ink may include, for example, inks having similar color compared to the conventional PANTONE® Violet color. Thus, in embodiments, the violet inks achieve the above $L^*$ values and match the color of a particular tint of the conventional PANTONE® Violet.

In embodiments, $L^*$ can be less than about 35, less than about 30, less than about 25. $a^*$ can be from about 40 to about 65, from about 43 to about 60, from about 45 to about 55. $b^*$ can be from about −80 to about −50, from about −75 to about −55, from about −70 to about −60.

In embodiments, violet inks may be produced by combining a violet colorant with an optional hue-adjusting colorant and an optional shade-adjusting colorant. Each of the violet, hue-adjusting and shade-adjusting colorants may be a single colorant or a combination of colorants, although the violet, hue-adjusting and shade-adjusting colorants may differ from each other.

In embodiments, the violet inks disclosed herein may contain any suitable violet colorant. Violet colorants include a colorant or combination of colorants that show spectral reflectance wavelengths of light from about 410 nm to about 480 nm Violet colorants may include colorants, such as, Hostaperm Violet RL 02, Pigment Violet 23, Violet BL01, Violet RL spec., Violet RL-NF, Violet A-RL 100, Violet E-BL and combinations thereof.

Hue-adjusting colorants for a violet ink may include a colorant or combination of colorants composed of at least violet pigment. The hue-adjusting colorant may be present in an amount of from about 0.001% to about 1% by weight of the ink, from about 0.04% to about 0.2% by weight of the ink.

In embodiments, shade-adjusting colorants for a violet ink may include a colorant or combination of colorants that absorb wavelengths of light from about 400 to about 500 nm. More specifically, shade-adjusting colorants with a spectral reflectance of light in the wavelength range from about 420 to about 480 nm may be used.

The total colorant may comprise from about 0.1% to about 10% by weight of the ink, from about 0.2% to about 5% by weight of the ink.

Colorants suitable for use herein include pigment particles having an average particle size of from about 15 nm to about 500 nm, from about 50 nm to about 200 nm in volume average diameter.

Additional Additives

The ink vehicles of embodiments may be mixtures of curable components and, optionally, additional materials including curable solids, antioxidants, non-photoinitiated activators (e.g., MARK® K 102, MARK® K 104 and ACTAFOAM® R-3, all commercially available from Compton Corp.), as well as any conventional optional additives. Such conventional additives may include, for example, defoamers, slip and leveling agents, pigment dispersants, surfactants, optical brighteners, thixotropic agents, dewetting agents, slip agents, foaming agents, antifoaming agents, flow agents, waxes, oils, plasticizers, binders, electrical conductive agents, fungicides, bactericides, organic and/or inorganic filler particles, UV absorbers, leveling agents, opacifiers, antistatic agents, and the like. The inks may also include additional monomeric, oligomeric, or polymeric materials as desired.

Curable Solids

Curable solids include radiation-curable materials that are solids at room temperature and have one or more unsaturated functional groups therein, such as, one or more alkene, alkyne, acrylate or methacrylate reactive groups. In embodiments, the curable solids are low molecular weight curable solids. As used herein, the term, "low molecular weight," refers to compounds having a weight average molecular weight of about 500 daltons or less, about 150 to about 450 daltons, from about 200 to about 400 daltons.

In embodiments, the curable solid is an alkyl acrylate, aryl acrylate, alkylaryl acrylate, aryl alkyl acrylate, alkyl methacrylate, aryl methacrylate, alkylaryl methacrylate or aryl alkyl methacrylate.

The curable solid may be present in any effective amount of the curable inkjet ink compositions, such as, for example, from about 25 wt % to about 75 wt %, from about 30 wt % to about 70 wt %, from about 40 wt % to about 70 wt % of the overall weight of the ink.

Antioxidants

The radiation-curable gel ink compositions can also optionally contain an antioxidant. The optional antioxidants of the ink compositions protect the images from oxidation and also protect the ink components from oxidation during the heating portion of the ink preparation process. Specific examples of suitable antioxidant stabilizers include NAUGARD 524, NAUGARD 635, NAUGARD A, NAUGARD 1-403, and NAUGARD 959, commercially available from Crompton Corporation, Middlebury, Conn.; IRGANOX 1010, and IRGASTAB UV 10, commercially available from Ciba Specialty Chemicals; GENORAD 16 and GENORAD 40 commercially available from Rahn AG, Zurich, CH and the like.

When present, the optional antioxidant is present in the ink compositions of embodiments in any desired or effective amount, such as, at least about 0.01% by weight of the ink composition, at least about 0.1% by weight of the ink composition, at least about 1% by weight of the ink composition.

Ink Preparation

In embodiments, the radiation-curable gel inks may be prepared by any suitable technique. For example, the inks may be prepared by mixing the initiator, monomer, optional gellant and the curable wax; and heating the mixture to obtain a single phase with low viscosity. Thereafter, the hot mixture is slowly added to a heated colorant (i.e. pigment) dispersion (which may be a concentrate) while agitating the mixture. The ink composition may then be, optionally at an elevated temperature, passed through a filter to remove extraneous particles.

The method of preparation for the ink compositions may be modified so as to accommodate the type of reactive gelling agents used for the preparation of the ink compositions. For example, a concentrate of the gelling agent may be prepared in one of the components of the ink composition prior to the addition of the other components. Solutions containing co-gelling agents can also be prepared by a method similar to the one described above. Further examples of ink preparation methods are set forth in the Examples below.

In embodiments, the ink compositions may have gelling temperatures of from about 30° C. to about 75° C., from about 30° C. to about 70° C., from about 35° C. to about 70° C. Generally, the ink composition is a gel at room temperature.

In embodiments, when the ink composition is in the gel state, the viscosity of the ink composition is at least about 1,000 mPas, at least about 10,000 mPas, at least about 100,000 mPas. The viscosity values in the gel state of exemplary ink compositions may be in the range of from about $10^3$ to about $10^9$ mPas, from about $10^{4.5}$ to about $10^{6.5}$ mPas. Gel phase viscosity of embodiments can vary with the print process. For example, the highest viscosities may be suitable for use in embodiments that employ intermediate transfer or when jetting directly to porous paper to minimize the effects of ink bleed and feathering. On the other hand, less porous substrates, such as plastic, may require lower viscosities that control dot gain and agglomeration of individual ink pixels. The gel viscosity can be controlled by ink composition and substrate temperature. An additional benefit of the gel state for radiation-curable gellant-containing ink compositions is that higher viscosities of about $10^3$-$10^4$ mPas can reduce oxygen diffusion, which, in turn leads to a faster rate of cure in free radical initiation.

When the ink composition is at jetting temperature, the ink composition has a viscosity of less than about 15 mPas, less than about 12 mPas, from about 3 to about 12 mPas, from about 5 to about 10 mPas. In embodiments, the ink compositions are jetted at temperatures of less than about 100° C., from about 40° C. to about 100° C., from about 55° C. to about 90° C.

In embodiments, the violet gel ink when printed on paper has a mass of from about 0.1 to about 1.5 mg/cm$^2$, from about 0.4 to about 0.7 mg/cm$^2$.

Image Forming and Inkjet Devices

Gel ink jet printing process and apparatuses are well known in the art and may include either direct or indirect image formation.

Printed images may be generated with the ink described herein by incorporating the ink into an inkjet device, such as, a thermal inkjet device, an acoustic inkjet device or a piezoelectric inkjet device, and concurrently causing droplets of molten ink to be ejected in an imagewise manner onto a substrate. In embodiments, the ink may be heated to a jetting temperature, for instance, above the gel-transition temperature of the ink composition.

In embodiments, the substrate may be at any suitable temperature during recording. The recording substrate may be at room temperature. However, in some embodiments, the substrate may be heated or cooled to have a surface temperature that is, for example, within the range of gel phase transition temperatures for the ink composition. For example, the substrate may be maintained at a temperature of from about 5° C. to about 160° C., from about 15° C. to about 50° C., from about 20° C. to about 40° C.

The ink is typically included in at least one reservoir connected by any suitable feeding device to the ejecting channels and orifices of an inkjet head. In the jetting procedure, the inkjet head may be heated, by any suitable method, to the jetting temperature of the inks. The ink reservoir(s) may also include heating elements to heat the ink. The UV inks are thus transformed from the gel state to a molten state for jetting. "At least one," or, "one or more," as used to describe components of the inkjet device, such as the ejecting channels, orifices, etc., refers to from 1 to about 2 million, from about 1000 to about 1.5 million, from about 10,000 to about 1 million of any such component found in an inkjet device. "At least one," or, "one or more," as used to describe other components of the inkjet device such as the inkjet head, reservoir, feeder etc., and refers to from 1 to about 15, from 1 to about 8, from 1 to about 4 of any such component found in the inkjet device.

The inks may also be employed in indirect (offset) printing ink jet applications, where droplets of the melted ink are ejected in an imagewise manner onto an intermediate transfer member and the ink in the imagewise pattern is subsequently transferred from the intermediate transfer member to a final recording substrate. An exemplary offset or indirect printing process is disclosed in U.S. Pat. No. 5,389,958, the disclosure of which is incorporated herein by reference.

The intermediate transfer member may take any suitable form, such as, a drum or a belt. The member surface may be at room temperature or may be heated to have a surface temperature, for example, within the gel state temperature range for the ink composition. For example, the surface may be maintained at a temperature of about 25° C. to about 100° C., from about 30° C. to about 70° C., from about 30° C. to about 50° C. Hence, the jetted ink may be made to rapidly form a gel, which gel is maintained on the surface of the transfer member until transfer to the image-receiving substrate. Thus, the ink may be heated to a jetting temperature, for instance, above the gel transition temperature of the ink composition and then heated to a second temperature at which the gel forms that is less than the first temperature.

Once on the intermediate transfer member surface, the jetted ink may be exposed to a limited extent of radiation so as to effect a limited curing of the ink on the intermediate transfer member surface. The intermediate curing does not fully cure the ink, but merely assists in setting the jetted ink so that the ink may be transferred to the image receiving substrate with the appropriate amount of penetration, which requires the ink droplets to have a certain rheology before transfer. For controlling the extent of the curing if an intermediate cure is practiced, reference is made to US Publ. Nos. 2006/0158496 and 2006/0119686, each incorporated herein by reference. The intermediate curing step is not necessary, such as, when the gel state is sufficient to impart the desired rheology to the ink droplets.

Following jetting to the intermediate transfer member and optional intermediate curing thereon, the ink composition is then transferred to a suitable substrate.

The ink can be jetted or transferred onto any suitable substrate or recording sheet to form an image including plain papers, such as, XEROX 4200 papers, XEROX Image Series papers, Courtland 4024 DP paper, ruled notebook paper, bond paper and the like; silica-coated papers, such as, Sharp Company silica-coated paper, JuJo paper, HAMMERMILL LASERPRINT paper and the like; glossy papers, such as, XEROX Digital Color Gloss, Sappi Warren Papers LUSTRO-GLOSS and the like; transparency materials; fabrics; textile products; plastics; polymeric films; inorganic substrates such as metals, ceramics, wood; and the like.

Following transfer to the substrate or jetting to the substrate if direct printing is employed, the ink is cured by exposing the image on the substrate to radiation. For example, radiation having an appropriate wavelength, mainly the wavelength at which the ink initiator absorbs radiation, may be used. That initiates the curing reaction of the ink composition. The radiation exposure need not be long and may occur from about 0.05 to about 10 seconds, from about 0.2 to about 2 seconds. The exposure times are more often expressed as substrate speeds of the ink composition passing under a UV lamp. For example, the microwave energized, doped mercury bulbs available from UV Fusion are placed in an elliptical mirror assembly that is 10 cm wide; multiple units may be placed in series. Thus, a belt speed of 0.1 ms$^{-1}$ would require 1 second for a point on an image to pass under a single unit, while a belt speed 4.0 ms$^{-1}$ would require 0.2 seconds to pass under four bulb assemblies.

In embodiments, the energy source used to initiate crosslinking of the radiation-curable components of the composition may be actinic, such as, radiation having a wavelength in the ultraviolet or visible region of the spectrum; accelerated particles, such as, electron beam radiation; thermal, such as, heat or infrared radiation; or the like. Actinic radiation provides excellent control over the initiation and rate of crosslinking. Suitable sources of actinic radiation include mercury lamps, xenon lamps, carbon arc lamps, tungsten filament lamps, lasers, light emitting diodes, sunlight, electron beam emitters and the like. The curing light may be filtered or focused, if desired or necessary.

The curable components of the ink composition react to form a cured or cross-linked network of appropriate hardness and robustness. In embodiments, the curing is substantially complete to complete, i.e., at least 75% of the curable components are cured (reacted and/or cross-linked). That allows the ink composition to be substantially hardened and much more scratch resistant, and also adequately controls the amount of show-through on the substrate.

The following examples of radiation-curable gel ink compositions further illustrate the foregoing embodiments. The Examples are illustrative of different compositions and conditions that can be utilized in practicing the disclosure. It will be apparent, however, that the disclosure can be practiced with many types of compositions and can have many different uses in accordance with the disclosure above.

EXAMPLES

Example 1

Preparation of Ink Base

The inks were prepared with an amide gellant. The UNILIN 350 acrylate wax (optionally prefiltered to 2 μm) was the curable wax. An ink carrier was SR833S (Sartomer). Initiators included Irgacure 379, Esacure KIP 150 (Lamberti) and Irgacure 819, Ciba. The stabilizer was Irgastab UV10 (Ciba).

Synthesis of Amide Gellant Precursor

The synthesis of the amide gellant precursor (organoamide) is as practiced in U.S. Pat. No. 8,084,637, for example, reacting a dimer diacid, such as, Pripol 1009 (Cognis Corp.) with ethylenediamine (EDA) at a temperature of between about 90° C. to about 155° C., optionally in the presence of an antioxidant/stabilizer, such as, Irgafos 168 (Ciba) in an amount of about 0.2%. Oligomers are created during preparation of the organoamide (end-capping to make the esters in the final gellant does not change the oligomer distribution).

By controlling the amount of EDA, the distribution can be shifted to create larger proportions of higher order oligomers. Generally, with higher EDA:amide ratios, a higher gel point and room temperature viscosity is observe An amide gellant precursor using an EDA:Pripol 1009 ratio of 1.125:2 was prepared by adding to a 2 L stainless steel reactor equipped with baffles and 4-blade impeller, Pripol 1009 dimer diacid (703.1 g, acid number=194 mg/g, 1215 mmol). The reactor was purged with argon, heated to 90° C. and the impeller was set to 400 RPM. Next, EDA (Huntsman Chemical Corporation, 21.9 g, 364 mmol) was added slowly through a feed line directly into the reactor over 15 minutes. The reactor temperature was set at 95° C. Next, the reactor temperature was ramped up to 165° C. over 280 minutes and held at 165° C. for 1 hour. Finally, the molten organoamide product was discharged into a foil pan and allowed to cool to room temperature. The product was an amber-coloured solid resin with an acid number of 133.7 mg/g.

The acid termini of the precursor was end-capped with phenyl glycol following the materials and methods provided in U.S. Pat. No. 8,084,637. The oligomeric distributions for the amide gallant is summarized in Table 1.

A baseline amide gellant precursor using an EDA:Pripol 1109 ratio of 1.125:2 was prepared as follows. To a 2 L stainless steel Buchi reactor equipped with 4-blade steel impeller, baffle, and condenser was added the organoamide prepared above (711.8 g, acid number of 133.7, 614.65 mmol) via the addition port and using a heat gun to melt the materials. Next, the reactor was purged with $N_2$ at 3 SCFH (standard cubic feet per hour) flow rate, heated to 210° C. and mixing at 450 RPM. Next, 2-phenoxyethanol (281.2 g, 2035.4 mmol, Aldrich Chemicals) and Fascat 4100 (0.70 g, 2.05 mmol, Arkema Inc.) were premixed in a beaker, and added to the reaction. The reaction port was closed and the reaction was held at 210° C. for 2.5 hours. The reactor port was opened and an additional 27.5 g of phenoxyethanol were added and the reaction was allowed to run for 4 hours. After the reaction was completed, the molten gellant product was discharged into a foil pan and allowed to cool to room temperature. The product was an amber-colored firm gel with an acid number of 3.9 mg/g.

TABLE 1

| Mw Distributions by MALDI-TOF of Amide Gellant | | |
|---|---|---|
| n | Name | Amide Gellant |
| 0 | Unimer | 26.7 |
| 1 | Dimer | 57.6 |
| 2 | Trimer | 14.7 |
| 3 | Tetramer | 0.9 |

Synthesis of UNILIN® 350 Acrylate at 5 gal Scale

About 5.4 kg of UNILIN® 350, 6.8 g of hydroquinone, 53.5 g of p-toluene sulfonic acid and 1.1 kg of toluene were charged through the charge port into a reactor. The charge port was closed and the reactor was heated to a jacket temperature of 120° C. Agitation was begun at minimum once the reactor contents reached a temperature of approximately 65° C. Once the internal reactor temperature reached 85° C., signaling that the solids have melted, agitation was increased to 150 rpm. The final two reagents were added via a Pope tank. First, 1.32 kg of acrylic acid were added and then the Pope tank and lines were rinsed through the reactor with 1.1 kg of toluene. The time of acrylic acid addition was marked as time zero. The jacket temperature was then ramped from 120° C. to 145° C. over 120 minutes. That was done manually with an increase of 2° C. every 10 minutes. During that time, reaction condensate (water) was cooled and collected by a condenser. Approximately 200 g of water were collected. Also, approximately 1.1 kg of toluene (50% of the charge) were removed by distillation along with the reaction condensate.

Once the reactor jacket reached the maximum temperature of 145° C., cooling was begun to bring the reactor to a batch temperature of 95° C. Agitation was reduced to 115 rpm. About 23 kg of deionized water ("DIW") were brought to boil and then charged to the reactor via the Pope tank (temperature of water by the time of transfer was greater than 90° C.). Mixing continued for 30 seconds and, after mixing was stopped, the water and waxy acrylate phases were allowed to separate. The bottom (water) phase was discharged to a steel pail from the bottom valve using the sight glass to monitor the interface. The extraction procedure was repeated with another 2.7 kg of hot DIW and the water discharged to a pail. A third and final extraction was conducted with 10 kg of hot DIW, separated but not discharged to a pail. Instead, the hot water layer was used to preheat the discharge line to a vacuum filter.

At the start of the experiment day, preparations were made to a vacuum filter for the discharge and precipitation steps. The filter was charged with 100 kg of DIW. Cold DIW cooling and agitation at minimum were begun to the jacket of the filter to facilitate cooling the DIW to less than 10° C. for product solidification.

Following the third extraction, maximum agitation was begun to the filter. The reactor, the filter and the discharge lines were all checked for proper bonding and grounding, and both vessels were purged with nitrogen to ensure an inert atmosphere. The reactor was isolated and a moderate (10 SCFH [?]) nitrogen blanket on the filter was begun, and was maintained throughout the discharge procedure.

After the final 10 min. of separation and once Tr=95° C., 5 kPa of nitrogen pressure were applied to the reactor. That ensured an inert atmosphere throughout the discharge procedure. The bottom valve was opened slightly and the hot reactor contents were slowly poured into the filter. The first layer was water and the next layer was the desired UNILIN 350 acrylate, which solidified into yellowish white particles. Once the discharge was complete, all nitrogen purges was stopped and both vessels vented to the atmosphere. Agitation continued on the filter for approximately 10 minutes. A flexible transfer line was connected from the central vacuum system to a waste receiver. Full vacuum was applied to the waste receiver, then the bottom valve of the filter was opened to vacuum transfer the water filtrate.

Once a dried sample of the material had an acid number of <1.5, the batch was discharged by hand into foil-lined trays and dried in a vacuum oven at 55° C. with full vacuum overnight. The next day, the dry material was discharged and stored in 5 gallon pails. The yield from the batch was approximately 5.2 kg.

Inks were each prepared on a 20 gram scale by combining all components, except the pigment dispersion, and mixing the components at 90° C. and 200 rpm for approximately 1 hour. After 1 hour, the pigment dispersion was added to each ink and the combined ink composition was stirred at 90° C. for an additional hour. The inks were fully miscible, giving solutions with a pourable viscosity at elevated temperatures and forming stiff gels when cooled to room temperature.

Violet Pigment Dispersion Preparation

Into a 1 liter Attritor (Union Process) were added 1200 grams stainless steel shots (⅛ inch diameter), 30 grams Hostaperm Violet RL 02 pigment (Violet 23, Clariant), 18 grams EFKA 4340 dispersant, neat (BASF) and 152 grams SR9003 monomer (Sartomer). The mixture was stirred for 18 hours at 400 RPM, and then discharged into a 200 mL container. The resulting pigment dispersion has a pigment concentration of 15 weight percent.

Ink Preparation

Various UV curable phase change ink compositions were prepared. To a 250 mL amber glass bottle heated to 90° C. were added amide gellant, acrylated Unilin 350 wax, SR833S monomer (tricyclodecane dimethanol diacrylate, Sartomer, Exeter, Pa.), SR399LV (pentafunctional acrylate ester, Sartomer), Irgaure 379 and 819 (photoinitiators, CIBA), Esacure KIP 150 (photoinitiator, Lamberti) and Irgastab UV10 (stabilizer, CIBA). The mixture was heated with stirring until the solid components were dissolved. The mixture was heated with stirring for 1 hour to complete the ink base preparation. Finally, a violet pigment dispersion concentrate in SR9003 (propyxlated neopentyl glycol diacrylate, Sartomer) was added and the mixture was homogenized at 10,000 RPM for an additional 0.5 hours. About 7.5 g of amide gellant, 5 g of UNILIN 350 acrylate, 3 g of IRGACURE® 379 (Ciba), 0.5 g of IRGACURE® 819, 44 g Esacure KIP 150 (Lamberti), 0.2 g of IRGASTAB® UV10, 5 g of SR399LV (Sartomer Company, Inc.) and 61.5 g of SR833S (Sartomer Company, Inc.) were mixed at 90° C. for 1 h. The ink base was filtered through a 1 μm stacked filter. The filtered ink base was added to a colorant mixture as shown in Table 2 and additional SR833S as required to make-up the mass balance, while stirring at 90° C. The resulting ink is stirred at 90° C. for 2 h, before filtration through a 1 μm filter.

TABLE 2

| Violet UV Gel Ink, 2 weight % Pigment Violet 23 | | |
|---|---|---|
| Violet UV Gel Ink Component | wt % | grams |
| Amide Gellant | 7.50% | 7.5 |
| Unilin 350-acrylate | 5.00% | 5.0 |
| SR833S | 61.47% | 61.5 |
| SR399LV | 5.00% | 5.0 |
| Irgacure 379 | 3.00% | 3.0 |
| Irgacure 819 | 0.50% | 0.5 |

TABLE 2-continued

Violet UV Gel Ink, 2 weight % Pigment Violet 23

| Violet UV Gel Ink Component | wt % | grams |
|---|---|---|
| Esacure KIP 150 | 4.00% | 4.0 |
| Irgastab UV10 | 0.20% | 0.20 |
| TOTAL | 100.0% | 100.0 |

Inks were printed on uncoated Mylar sheets using a Typhoon print head and cured with a 600 W Fusions UV Lighthammer UV curing lamp fitted with a mercury D bulb under a moving conveyor belt moving at various speeds (feet per minute—fpm). The cured films were subjected to double MEK rubs with a cotton swab to evaluate cure. Table 3 below summarizes the film MEK rub resistance properties. A good curing ink is considered one in which the double MEK rubs exceed 150 at all speeds. Violet UV gel inks have superior cure properties.

TABLE 3

Double rub results at various cure speeds

| Sample | 32 fpm | 90 fpm | 150 fpm | 240 fpm |
|---|---|---|---|---|
| Violet UV Gel Ink | 200 | 200 | 200 | 200 |

TABLE 4

Color for Violet Ink

| | Pigment wt % | Resolution | Drop Mass (ng) | Ink Concentration (mg/inch$^2$) | Pigment Concentration (mg/inch$^2$) | L* | a* | b* | $\Delta E_{2000}$ relative to Pantone ® |
|---|---|---|---|---|---|---|---|---|---|
| Violet UV Ink | 2 | 600 × 500 | 21.3 | 6.39 | 0.128 | 20.27 | 47.33 | −60.92 | 2.84 |

Color was measured preparing solid patch prints on DCEG paper. Drop mass, pigment concentration and resolution are provided in Table 4.

Prints were measured using a Spectrolino spectrophotometer, D50 light source, 2°. Table 3 above shows the pigment concentration on the solid fill image, as well as L*, a* and b* values, and $\Delta E_{2000}$ relative to PANTONE® Violet. The UV ink was jetted successfully and solid patches were measured to be all below $\Delta E_{2000}$ of 4 which is desired. Reflectance curves for the violet UV ink printed as a solid patch as compared to PANTONE® Violet were substantially identical. Note that violet may be further optimized by optionally adding small amounts of Pigment Blue 61 and/or carbon black (see, U.S. Pub. No. 20110014559, herein incorporated by reference in its entirety). Table 5 shows the reflectance % at key wavelengths of light for the violet color.

TABLE 5

Spectral Reflectance for Violet UV Gel Ink.

| | Spectral Reflectance % | | |
|---|---|---|---|
| Wavelength | 440 | 500 | 600 |
| Violet UV Gel Ink | 30.6% | 2.6% | 2.6 |

The reflectance percents at the listed wavelengths are critical to achieve the proper color for violet. Graphtol pigments from Clariant are compared and the test for lightfastness was determined on artificial light in accordance with DIN ISO 12 040 (XENONTEST 1200 W, non turning-mode).

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

We claim herein:

1. A violet radiation-curable lightfast gel ink, comprising: at least one curable monomer, at least one organic gellant, at least one photoinitiator and a violet colorant, wherein the ink exhibits a reflectance on a substrate at a loading of from about 2 mg/inch$^2$ to about 7 mg/inch$^2$ that ranges from 20% to about 50% at a wavelength of 440 nm, that ranges from 0% to about 10% at a wavelength of about 500 and 630 nm, and that ranges from 0% to about 10% at a wavelength of about 630 nm, and wherein the resulting ink matches Pantone Violet in color within a $\Delta E_{2000}$ of about 3 or less.

2. The radiation curable ink of claim 1, further comprising a violet pigment and optionally a pigment blue or a carbon black.

3. The radiation curable ink, of claim 1, wherein said ink on said substrate exhibits an L* of less than about 30.

4. The radiation curable ink of claim 1, wherein said ink on said substrate exhibits an a* of from about 40 to about 65.

5. The radiation curable ink of claim 1, wherein said ink on said substrate exhibits a b* of from about −80 to about −50.

6. The radiation curable ink of claim 1, wherein the colorant is selected from the group consisting of Violet RL 02, Pigment Violet 23, Violet BL01, Violet RL spec., Violet RL-NF, Violet A-RL 100, Violet E-BL, and combinations thereof.

7. The radiation curable ink of claim 1, wherein the substrate is selected from the group consisting of paper, metal, plastic, membrane and combinations thereof.

8. The radiation curable ink of claim 1, wherein the colorant is present in an amount of from about 0.05% to about 6% by weight of the ink.

9. The radiation curable ink of claim 1, wherein the at least one curable monomer is selected from the group consisting of propoxylated neopentyl glycol diacrylate, diethylene glycol diacrylate, triethylene glycol diacrylate, hexanediol diacrylate, dipropyleneglycol diacrylate, tripropylene glycol diacrylate, epoxylated neopentyl glycol diacrylate, isodecyl acrylate, tridecyl acrylate, isobornyl acrylate, isobornyl (meth)acrylate, propoxylated. trimethylolpropane triacrylate, ethoxylated trimethylolpropane triacrylate, di-trimethylolpropane tetraacrylate, dipentaerythritol pentaacrylate, ethoxylated pentaerythritol tetraacrylate, propoxylated glycerol triacrylate, isobornyl methacrylate, lauryl acrylate, lauryl methacrylate, neopentyl glycol propoxylate methylether monoacrylate, isodecylmethacrylate, caprolactone acrylate, 2-phenoxyethyl acrylate, isooctylacrylate, isooctylmethacrylate, and combinations thereof.

10. The radiation curable ink of claim 1, further comprising a wax.

11. The radiation curable ink of claim 1, further comprising a non-photoinitiated activator.

12. The radiation curable ink, of claim 1, wherein the radiation curable ink exhibits lightfastness of 6 or greater on the Blue Wool Scale.

13. The radiation curable ink of claim 1, wherein the radiation curable ink exhibits a double MEK rub of about 200 at 32 feet per minute (fpm), 90 fpm, 150 fpm, or 240 fpm.

14. A method of making a violet radiation-curable ink comprising:
mixing at least one curable monomer, at least one organic gellant, at least one photoinitiator, and at least one violet colorant, wherein the ink exhibits a reflectance on a substrate at a loading, of from about 2 mg/inch$^2$ to about 7 mg/inch$^2$ that ranges from 20% to about 50% at a wavelength of 440 nm, that ranges from 0% to about 10% at a wavelength of about 500 and 630 nm, and that ranges from 0% to about 10% at a wavelength of about 630 nm;
heating the mixture; and
cooling the heated mixture to form a gel ink,
wherein the resulting ink matches Pantone Violet in color within a $\Delta E_{2000}$ of about 3 or less.

15. The method of claim 14, further comprising mixing a pigment blue or a carbon black.

16. The method of claim 14, wherein the at least one curable monomer is selected from the group consisting of propoxylated neopentyl glycol diacrylate, diethylene glycol diacrylate, triethylene glycol diacrylate, hexanediol diacrylate, dipropyleneglycol diacrylate, tripropylene glycol diacrylate, epoxylated neopentyl glycol diacrylate, isodecyl acrylate, tridecyl acrylate, isobornyl acrylate, isobornyl (meth)acrylate, propoxylated trimethylolpropane triacrylate, ethoxylated trimethylolpropane triacrylate, di-trimethylolpropane tetraacrylate, dipentaerythritol pentaacrylate, ethoxylated pentaerythritol tetraacrylate, propoxylated glycerol triacrylate, isobornyl methacrylate, lauryl acrylate, lauryl methacrylate, neopentyl glycol propoxylate methylether monoacrylate, isodecylmethacrylate, caprolactone acrylate, 2-phenoxyethyl acrylate, isooctylacrylate, isooctylmethacrylate, and combinations thereof.

17. The method of claim 14, wherein the colorant is selected from the group consisting of Violet RE, 02, Pigment Violet 23, Violet BL01, Violet RL spec., Violet RL-NF, Violet A-RL 100, Violet E-BL, and combinations thereof, and wherein violet colorant concentration on the substrate by dry weight is 0.1 mg/inch$^2$ or greater.

18. The method of claim 14, wherein said ink on said substrate exhibits one or more of an L* of less than about 30; an a* of at least about 40 to about 65; a b of at least about 50 to about −80.

19. The method of claim 14, wherein the radiation curable ink exhibits a double MEK rub of about 200 at 32 feet per minute (fpm), 90 fpm, 150 fpm, or 240 fpm.

\* \* \* \* \*